US 12,119,285 B2

(12) United States Patent
Oh et al.

(10) Patent No.: US 12,119,285 B2
(45) Date of Patent: Oct. 15, 2024

(54) IMAGE SENSOR WITH ACTIVELY COOLED SENSOR ARRAY

(71) Applicant: Microsoft Technology Licensing, LLC, Redmond, WA (US)

(72) Inventors: Minseok Oh, Santa Clara, CA (US); Satyadev Hulikal Nagaraja, San Jose, CA (US); Cyrus Soli Bamji, Fremont, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 305 days.

(21) Appl. No.: 17/446,954

(22) Filed: Sep. 3, 2021

(65) Prior Publication Data

US 2023/0074679 A1    Mar. 9, 2023

(51) Int. Cl.
*H01L 27/146* (2006.01)
*H01L 23/38* (2006.01)
*H01L 31/024* (2014.01)

(52) U.S. Cl.
CPC ........ *H01L 23/38* (2013.01); *H01L 27/14632* (2013.01); *H01L 27/14687* (2013.01); *H01L 31/024* (2013.01)

(58) Field of Classification Search
CPC .... H01L 23/38; H01L 31/024; H01L 27/1464
See application file for complete search history.

(56) References Cited

U.S. PATENT DOCUMENTS

| | | | | |
|---|---|---|---|---|
| 3,136,134 A | * | 6/1964 | Smith | F25B 21/02 136/238 |
| 4,292,579 A | * | 9/1981 | Constant | H10N 10/00 310/306 |
| 5,856,210 A | * | 1/1999 | Leavitt | H10N 10/01 438/54 |
| 5,921,087 A | * | 7/1999 | Bhatia | H10N 10/13 136/203 |
| 6,002,081 A | * | 12/1999 | Sakuragi | H10N 10/13 136/203 |
| 6,094,919 A | * | 8/2000 | Bhatia | H01L 23/38 62/3.2 |

(Continued)

FOREIGN PATENT DOCUMENTS

CN     110047808 A     7/2019
WO    2014192199 A1    12/2014

OTHER PUBLICATIONS

Boukai, et al., "Silicon nanowires as efficient thermoelectric materials", In Journal of Nature, vol. 451, Jan. 10, 2008, pp. 168-171.

(Continued)

*Primary Examiner* — Mounir S Amer
*Assistant Examiner* — Alexander Belousov
(74) *Attorney, Agent, or Firm* — Alleman Hall & Tuttle LLP

(57) ABSTRACT

An image sensor comprises an array of sensor elements, each responsive to incident photon flux, and a readout circuit coupled electronically to the array of sensor elements and configured to release an electronic signal varying in dependence on the incident photon flux. A thermal-barrier zone separates the array of sensor elements from the readout circuit, and a solid-state cooler is coupled thermally to the array of sensor elements.

14 Claims, 8 Drawing Sheets

(56) References Cited

U.S. PATENT DOCUMENTS

| | | | | |
|---|---|---|---|---|
| 6,226,994 B1* | 5/2001 | Yamada | ............ | H10N 10/17 |
| | | | | 136/203 |
| 6,233,944 B1* | 5/2001 | Yamada | ............ | H10N 10/17 |
| | | | | 62/3.7 |
| 6,269,645 B1* | 8/2001 | Yamaguchi | ........... | F01K 27/02 |
| | | | | 60/653 |
| 6,274,803 B1* | 8/2001 | Yoshioka | ............ | H10N 10/01 |
| | | | | 136/203 |
| 6,288,321 B1* | 9/2001 | Fleurial | ............ | H10N 10/852 |
| | | | | 136/238 |
| 6,559,538 B1* | 5/2003 | Pomerene | ............ | H10N 10/852 |
| | | | | 257/467 |
| 6,620,994 B2* | 9/2003 | Rossi | ............ | H10N 10/852 |
| | | | | 136/238 |
| 6,800,933 B1* | 10/2004 | Mathews | ............ | H10N 10/01 |
| | | | | 257/470 |
| 7,838,760 B2* | 11/2010 | Venkatasubramanian | ............ | |
| | | | | H10N 10/852 |
| | | | | 136/203 |
| 7,838,986 B2* | 11/2010 | Tsao | ............ | F21K 9/00 |
| | | | | 362/373 |
| 9,183,000 B2* | 11/2015 | Ichida | ............ | H10N 10/00 |
| 9,379,167 B2* | 6/2016 | Chen | ............ | H10K 59/00 |
| 10,566,515 B2* | 2/2020 | Kasichainula | ............ | H02S 10/10 |
| 10,741,597 B2* | 8/2020 | Nakashikiryo | ... | H01L 27/14683 |
| 11,049,788 B2* | 6/2021 | Pace | ............ | H01L 31/024 |
| 11,456,323 B2* | 9/2022 | Sejima | ............ | H01L 27/14636 |
| 2002/0046762 A1* | 4/2002 | Rossi | ............ | H10N 10/853 |
| | | | | 136/238 |
| 2004/0238966 A1* | 12/2004 | Bottner | ............ | B81C 3/001 |
| | | | | 257/772 |
| 2006/0151796 A1* | 7/2006 | Kobayashi | ........ | H01L 27/14806 |
| | | | | 257/85 |
| 2008/0236643 A1* | 10/2008 | Li | ............ | H10N 10/17 |
| | | | | 136/203 |
| 2011/0089517 A1* | 4/2011 | Venezia | ............ | H01L 27/14603 |
| | | | | 257/443 |
| 2014/0070190 A1* | 3/2014 | Chen | ............ | H10K 59/00 |
| | | | | 257/40 |
| 2018/0040655 A1* | 2/2018 | Nakashikiryo | ... | H01L 27/14683 |
| 2018/0091723 A1* | 3/2018 | Funaki | ............ | H04N 23/745 |
| 2020/0321364 A1* | 10/2020 | Sejima | ............ | H04N 25/75 |
| 2021/0118763 A1* | 4/2021 | Pace | ............ | H01L 23/3672 |
| 2023/0071949 A1* | 3/2023 | Suzuki | ............ | H04N 25/63 |
| 2023/0074679 A1* | 3/2023 | Oh | ............ | H01L 23/38 |

OTHER PUBLICATIONS

Jeong, et al., "Thermal conductivity of bulk and thin-film silicon: A Landauer approach", In Journal of Applied Physics, 111, May 3, 2012, 8 Pages.

"International Search Report and Written Opinion Issued in PCT Application No. PCT/US22/036601", Mailed Date: Oct. 13, 2022, 8 Pages.

* cited by examiner

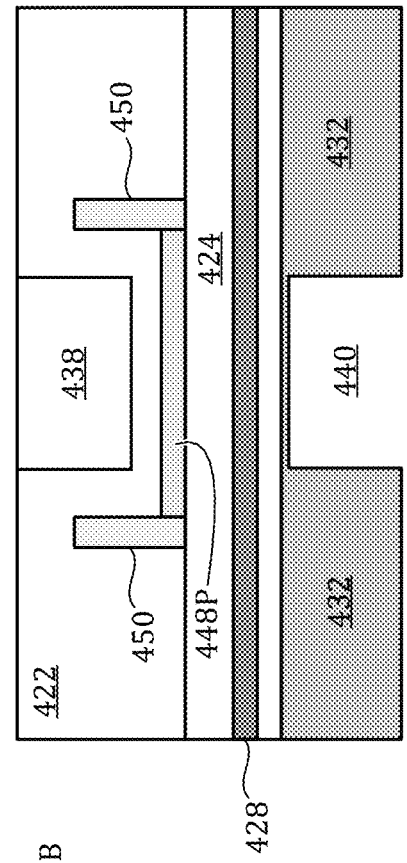
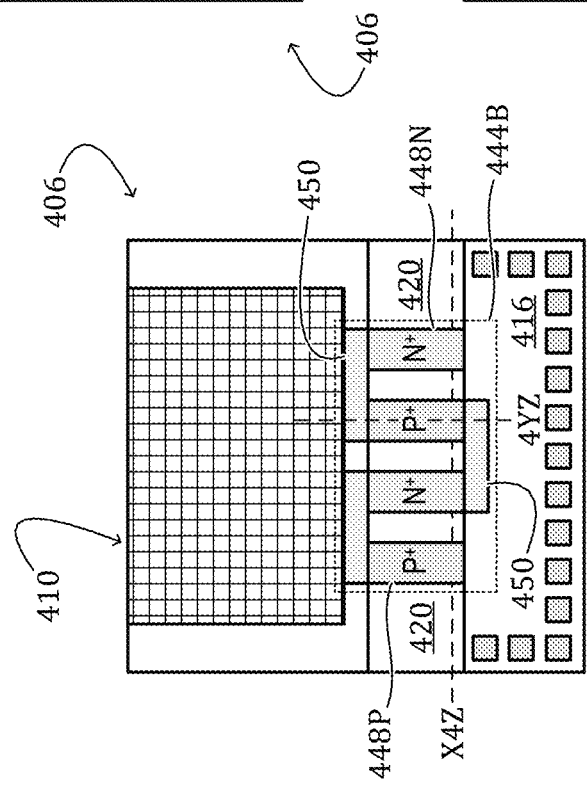

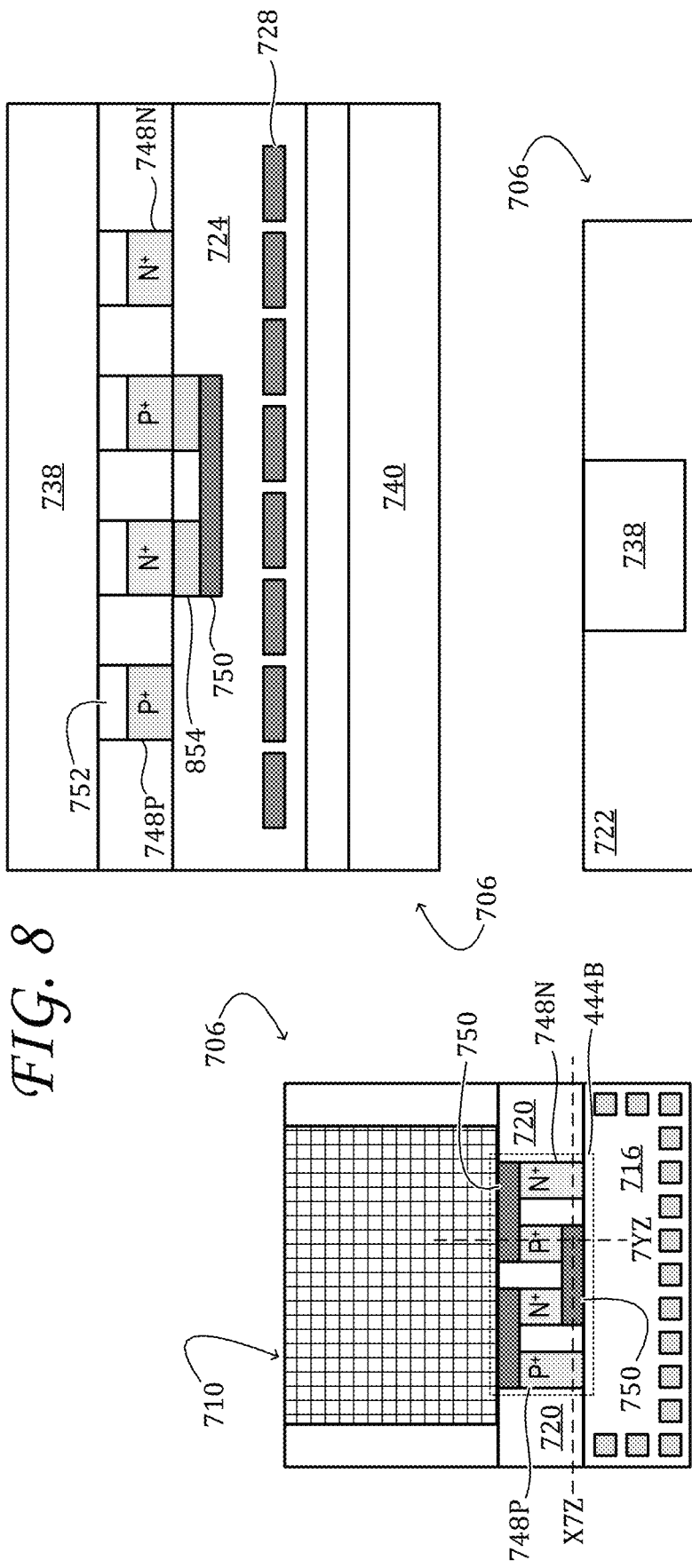
FIG. 8
FIG. 7
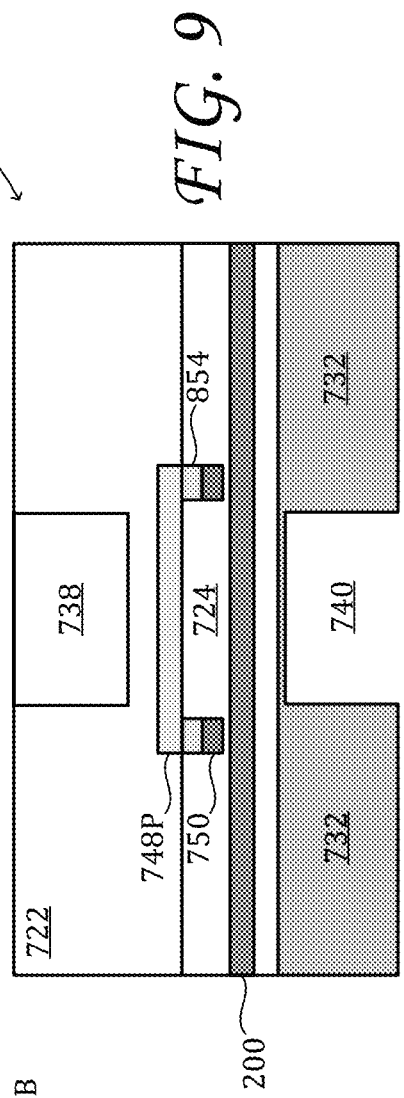
FIG. 9

IMAGE SENSOR WITH ACTIVELY COOLED SENSOR ARRAY

BACKGROUND

Over the last 20 years, digital-imaging technology has evolved at a remarkable pace. High-resolution, high-speed, high-sensitivity digital-image sensors are now available at low cost. Such sensors are found in color cameras, for example, and in a range of electronic devices targeting the consumer market. Significantly, digital image sensing is not limited to color-camera implementations, but may be used for infrared depth-vision and night-vision as well.

SUMMARY

One aspect of this disclosure relates to an image sensor comprising an array of sensor elements, each responsive to incident photon flux, and a readout circuit coupled electronically to the array of sensor elements and configured to release an electronic signal varying in dependence on the incident photon flux. A thermal-barrier zone separates the array of sensor elements from the readout circuit, and a solid-state cooler is coupled thermally to the array of sensor elements.

Another aspect of this disclosure relates to a method for fabricating an image sensor. The method comprises: forming an array of sensor elements on a sensor-wafer substrate; forming a readout circuit on the sensor-wafer substrate; forming a plurality of signal lines between the array of sensor elements and the readout circuit; forming a solid-state cooler between the array of sensor elements and the readout circuit; bonding a carrier-wafer substrate to an epitaxial structure of the sensor-wafer substrate; etching the carrier-wafer substrate in the thermal-barrier zone to form a carrier-wafer trench between the array of sensor elements and the readout circuit; reducing the thickness of the sensor-wafer substrate; and etching the sensor-wafer substrate in the thermal-barrier zone to form a sensor-wafer trench between the array of sensor elements and the readout circuit.

This Summary is provided to introduce in simplified form a selection of concepts that are further described in the Detailed Description. This Summary is not intended to identify key features or essential features of the claimed subject matter, nor is it intended to be used to limit the scope of the claimed subject matter. The claimed subject matter is not limited to implementations that solve any or all disadvantages noted in any part of this disclosure.

BRIEF DESCRIPTION OF THE DRAWINGS

FIGS. 4 through 6 show aspects of another example image sensor of a camera.

FIGS. 7 through 9 show aspects of another example image sensor of a camera.

DETAILED DESCRIPTION

Figure 1:
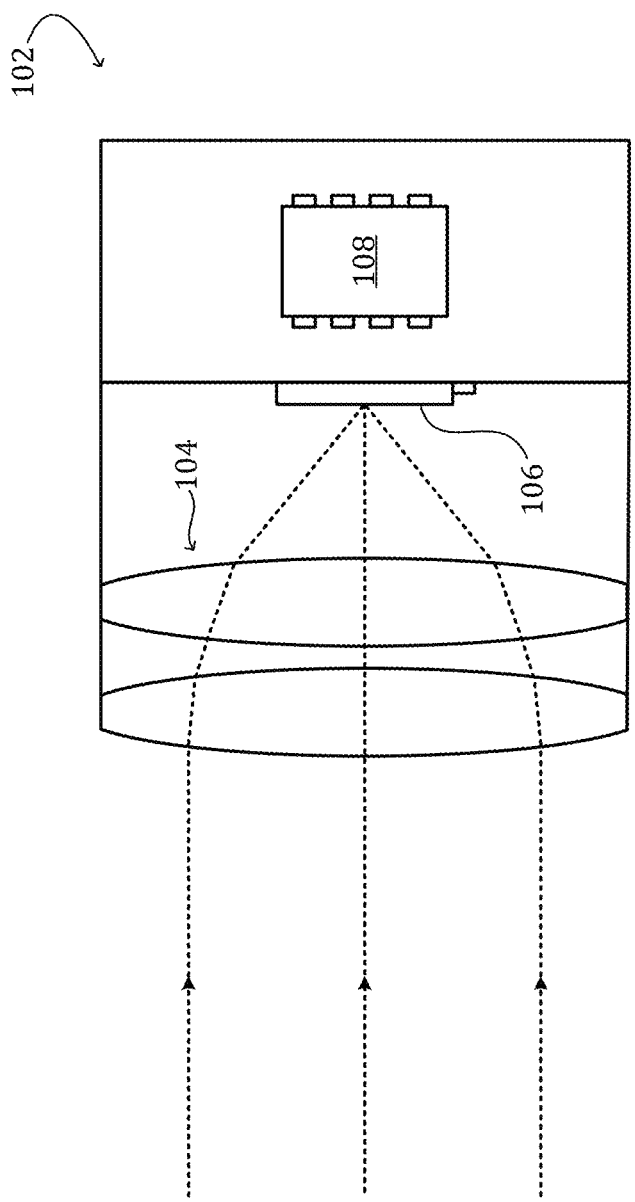
FIG. 1 shows aspects of an example camera.

This disclosure is presented by way of example and with reference to the drawing figures listed above. Components, process steps, and other elements that may be substantially the same in one or more of the figures are identified coordinately and described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

Complementary metal-oxide-semiconductor (CMOS) image-sensor technology is now refined to a level where high-resolution, single-photon counting is within reach. Standing in the way of that achievement are noise sources that corrupt the image signal. This disclosure recognizes that the dark-current noise may be the most problematic of the noise sources for a state-of-the-art CMOS image sensor. Significantly, the dark-current noise scales in parallel to the signal with increasing pixel area; it is not possible, therefore, to increase the signal-to dark-current noise ratio merely by increasing the pixel size.

One way to decrease the dark-current noise of an image sensor is to operate the image sensor at low temperature, thereby reducing the rate of thermal generation of electron-hole pairs (which lead to subsequent, undesired collection). That approach may be difficult to implement, however, for image sensors in compact consumer-electronics devices that operate over a wide range of ambient temperatures.

In view of the issues above, a series of actively cooled image sensors is disclosed herein, together with associated methods of fabrication. The disclosed active-cooling strategy recognizes that the dark-current noise is substantially a function of the temperature of the sensor array only, not of the readout circuit or associated electronics. Accordingly, only the sensor array requires cooling, and in this approach the cooling load may be very low because the sensor array in standard CMOS image sensors dissipates very minimal power. In the examples herein, CMOS processing is used to provide a thermal-barrier zone between the sensor array and other, more dissipative components formed on the same semiconductor die. This novel and non-obvious architecture reduces indirect heating of the sensor array and further limits the required cooling load. In some of the disclosed image sensors, active cooling is provided via a nanoscale Peltier-effect cooler fabricated within the thermal-barrier zone.

Turning now to the drawings, FIG. 1 shows aspects of an example camera 102 configured to acquire an optical image of a subject. Camera 102 may comprise a color camera, a monochrome camera, a hyperspectral (ultraviolet, infrared, or near-infrared) camera, and/or a depth camera. Envisaged depth-camera variants include structured-light cameras, time-of-flight (ToF) cameras, stereo cameras, and light-field cameras. In some examples, the camera may be configured to acquire, in rapid succession, a time-resolved sequence of images of the subject—i.e., video. Camera 102 may be a stand-alone camera device or a component of a multi-use electronic device. Such multi-use electronic devices are not particularly limited but may include smartphones, tablet computers, laptop computers, and virtual- or augmented reality systems, for example.

Camera 102 of FIG. 1 includes an objective lens system 104 configured to focus an optical image of the subject onto an image sensor 106. The image sensor is an integrated circuit (IC), such as a CMOS IC. The image sensor is coupled operatively to controller 108, which may be an onboard or networked computer of camera 102 or of the electronic device in which the camera is installed. In some examples the controller may include a processor and associated computer memory. In some examples the controller may include a system-on-a-chip (SoC), application specific integrated circuit (ASIC), or the like.

At low light intensity, image sensor 106 is prone to both temporal and spatial noise, with dark-current noise contributing to each of these. Dark current in a semiconductor p-n junction is due to the spontaneous, thermal creation of charge-carrier pairs within the junction, followed by collection of the minority carrier as though it were signal. Typically the magnitude of the dark current approximately doubles across every 6° C. interval of operating temperature. This causes both dark-current shot noise (in proportion to the signal) and dark-current offset (i.e., a false positive independent of signal). Due to its combined effects, the dark-current noise is a significant barrier to using CMOS image sensors for single-photon counting. Single-photon counting is believed to be the appropriate operating regime for very low-light photography and videography, such as night vision and ToF depth imaging using NIR illumination. As noted above and described in further detail below, the disclosed approach is to operate the light-sensing array of the image sensor (vide infra) within a range of about 10 to 20° C., where the dark-current noise becomes negligible for photon-counting operation.

Figure 2:
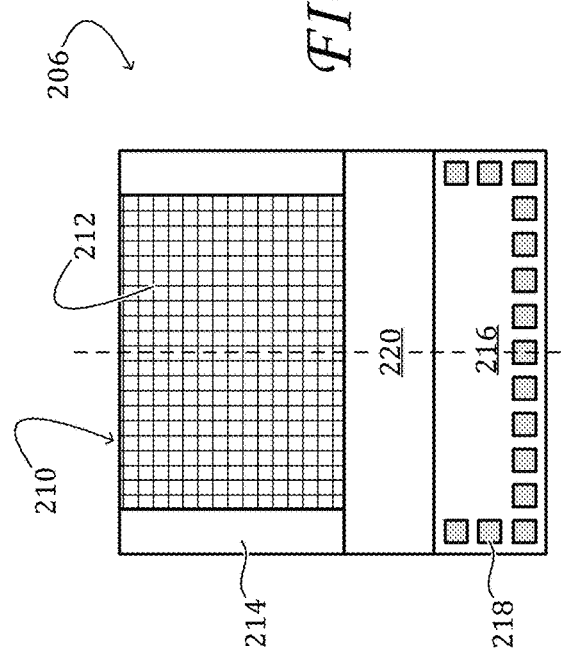
FIGS. 2 and 3 show aspects of an example image sensor of a camera.

FIG. 2 schematically shows aspects of an example image sensor 206 in plan view. Image sensor 206 includes sensor array 210—a rectangular array of sensor elements each responsive to incident photon flux. In some non-limiting examples the sensor array may be 6 to 7 micrometers (μm) in width and may include 2072 horizontal rows and 1507 vertical columns of sensor elements 212. Each sensor element may comprise, in some examples, a CMOS photodiode. Image sensor 206 also includes at least one row driver 214 and at least one readout circuit 216. Row driver 214 is a low-power circuit element configured to select the row of sensor array 210 to be read in the current readout operation. Coupled electronically to the sensor array, readout circuit 216 is configured to release an electronic signal that is based on the incident photon flux received by the sensor elements of the selected row. In other words, the electronic signal varies in dependence on the incident photon flux such that the magnitude of the signal reliably and predictably indicates the corresponding magnitude of photon flux on which the electronic signal is based. To that end, the readout circuit may be configured to amplify and digitize the charge sensed along each column of the sensor array. The readout circuit may include both analog and digital componentry—e.g., plural transconductance amplifiers analog-to-digital converters. In some examples, the readout circuit may include application-specific integrated-circuit (ASIC) componentry and may be referred to as an 'ASIC'. In the illustrated example, a plurality of bonding pads 218 are arranged around the readout circuit and coupled ohmically to the readout circuit. The bonding pads enable image sensor 206 to be addressed by controller 108.

Power dissipation in image sensor 206 is spatially inhomogeneous during operation of the image sensor. Sensor array 210 draws very little current, so joule heating in the area occupied by the sensor array is minimal. In contrast, readout circuit 216 may dissipate significant power during operation, as may other components of a camera or camera module—e.g., the controller, power supply, etc. Because the dark current increases with increasing temperature of sensor array 210, not of readout circuit 216 or other components, the dark-current noise may be reduced via active cooling of the sensor array only.

Any, some, or all of the area surrounding sensor array 210 may be configured to limit indirect heating of the sensor array by nearby components, which would otherwise increase the cooling load. In image sensor 206, for example, none of the thermally conductive bonding pads 218 are in direct thermal contact with the sensor array. Rather, a thermal-barrier zone 220 separates the sensor array from the bonding pads. In addition, the thermal-barrier zone separates the sensor array from the readout circuit. In this context, the term 'separate' conveys the idea that a space is engineered between the geometric area occupied by the sensor array and the geometric area occupied by the readout circuit. Features and/or physical properties within the space are selected so as to limit heat flow through the space. The term 'separate' does not absolutely preclude material or thermal continuity through the space but indicates that such continuity is engineered to be lessened. In some examples, In some examples, sensor array 210 may generate less than 1 milliwatt (mW) of heat during operation, so most of the cooling load is due to heat that diffuses in from outside of the sensor array. Accordingly, 200 milliwatts (mW) of active cooling may be sufficient to maintain the temperature of a well-insulated sensor array to within a range of 10 to 20° C. during operation. In that temperature range, the dark-current noise may be low enough to enable each sensor element 212 of the image sensor to count individual photons. In comparison, the solid-state coolers described herein may be configured to provide about 500 mW of cooling. The cooling may be localized to the sensor array and to the area within the thermal-barrier zone, such that other areas of the image sensor and/or camera device continue to operate at higher temperature, but without increasing the dark current.

Figure 3:
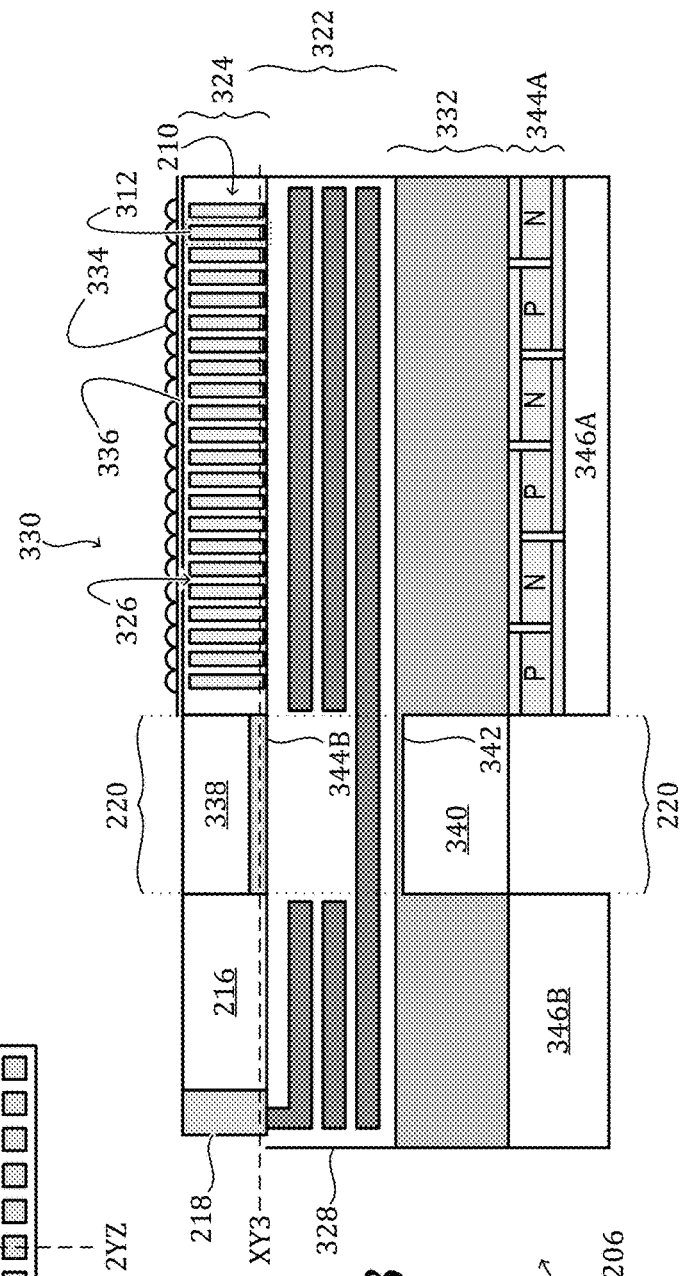

Continuing in the drawings, FIG. 2 shows a cutting plane 2YZ; FIG. 3 is a schematic cross section of image sensor 206 in cutting plane 2YZ, which illustrates the back-side illuminated (BSI) architecture of the image sensor. As shown in FIG. 3, active componentry of image sensor 206 is formed on sensor-wafer substrate 322. Typically the sensor-wafer substrate is a silicon substrate. The active componentry may be formed via state-of-the-art CMOS processing, resulting in an epitaxial structure 324 on the 'front' face of the sensor-wafer substrate, where the active componentry is arranged. Generally speaking, CMOS processing may include surface passivation, photolithography, ion implantation, dry etching, reactive-ion etching, atomic-layer etching, wet etching, plasma ashing, chemical mechanical polishing (CMP), thermal oxidation, thermal annealing, chemical- and physical-vapor deposition, atomic-layer deposition, electrochemical deposition, and/or molecular-beam epitaxy. More particularly, fabrication may include front-end-of-line (FEOL) processing to fabricate active componentry on the front face of the sensor-wafer substrate, back-end-of-line (BEOL) processing to lay down metal contacts, and BSI processing including attachment of a carrier wafer, subsequent thinning of the sensor-wafer substrate, and fabrication of passive componentry on the back (i.e., illuminated) face. In light of the BSI processing, the various layers of the epitaxial structure shown in FIG. 3 are added from top to bottom.

In image sensor 206 of FIG. 3, epitaxial structure 324 includes sensor array 210 and readout circuit 216 each formed therein. The epitaxial structure may also include other active componentry. Plural sensor elements 212 of sensor array 210 are formed in epitaxial structure 324 via FEOL processing and separated by (deep or shallow) trench isolation 326. The epitaxial structure also includes signal lines 328, which connect the columns of sensor elements 312 to readout circuit 216 and also connect the readout circuit to bonding pads 218. In some examples, the signal lines may comprise copper at a thickness of about 0.2 µm. In order to increase charge-carrier collection efficiency, the sensor-wafer substrate is thinned from back face 330, which is the face that receives the optical image of the subject. To support such thinning and to achieve other benefits, the completed epitaxial structure 324 is bonded to carrier-wafer substrate 332 (e.g., another silicon substrate), which provides structural rigidity for the thinned sensor-wafer during and after fabrication.

In the illustrated example, an array of microlenses 334 and one or more anti-reflective layers 336 are formed via microlens processing. In the illustrated example, each microlens 334 is positioned in registry with a corresponding sensor element 212 of sensor array 210.

Thermal-barrier zone 220 of image sensor 206 includes a sensor-wafer trench 338 etched into sensor-wafer substrate 322. In the illustrated example the sensor-wafer trench is continuous; it may be formed via deep-trench isolation (DTI) applied to the sensor-wafer substrate during BSI processing—i.e., back-side DTI or BDTI. The sensor-wafer trench may be about 0.2 µm wide and 6 to 6.5 µm deep in some examples. In other examples, a series of narrower sensor-wafer trenches—e.g., <0.1 µm wide and 0.2 to 0.25 µm deep may be formed via STI, also during FEOL processing. In one example, BDTI and STI may be used in combination to form a trench that extends substantially all the way through the sensor-wafer substrate in thermal-barrier zone 220. In another example, the all-the-way-through deep trench isolation in the sensor-wafer substrate may be enacted at the beginning of FEOL processing—e.g., near the STI process.

Thermal-barrier zone 220 of image sensor 206 includes a carrier-wafer trench 340 etched into carrier-wafer substrate 332. The carrier-wafer trench may be continuous and formed via DTI, for instance. In the illustrated example, DTI etching of the carrier-wafer trench leaves behind a ceiling 342 of the trenched carrier wafer. The ceiling may be about 50 µm thick in some examples. The carrier-wafer trench may have the same width as the sensor-wafer trench and a thickness determined by the selected trenching process. Generally speaking, the carrier-wafer trench and the sensor-wafer trench may be co-registered for increased resistance to heat flow. In other examples there may be no ceiling per se; in other words, the carrier-wafer substrate may be etched all the way to the BEOL oxide of the sensor wafer.

The trench structure of thermal-barrier zone 220 reduces thermal conduction into sensor array 210 by eliminating a significant depth of silicon on one side of the sensor array. At 130,000 mW per meter per Kelvin ($mWm^{-1}K^{-1}$), silicon is a good thermal conductor. Thus, when creating a thermal barrier, it is desirable to keep the silicon thickness to a minimum. In some examples sensor-wafer trench 338 and/or carrier-wafer trench 340 may be filed with air (26 $mWm^{-1}K^{-1}$). In examples in which additional mechanical strength is required, the sensor-trench and/or carrier trench may be filled with a thermally insulating, solid fill material. Example solid fill materials include dielectrics having lower thermal conductivity than the substrate-wafer substrate or the carrier-wafer substrate. Silicon dioxide (1,300 $mWm^{-1}K^{-1}$) is a typical fill material in standard CMOS STI and DTI and may be deposited within any, some, or all of the trenches herein to provide thermal insulation and mechanical strength.

In order to provide active cooling of sensor array 210, at least one solid-state cooler 344 is coupled thermally to the sensor array. In the examples disclosed herein, each solid-state cooler comprises a Peltier-effect cooler. A Peltier-effect cooler exploits the Peltier effect, where electric current is driven through a series of junctions comprising materials having (e.g., two) different charge-carrier concentrations. The current flow causes heat to flow from one type of junction to the other, and the junctions are arranged spatially so that the heat flows from a 'cold' side where cooling is desired to a 'hot' side intended to dissipate the heat. FIG. 3 shows two types of solid-state coolers, 344A and 344B, arranged in the same image sensor 206. In other examples, an image sensor may include only one of the two types of solid-state coolers.

Solid-state cooler 344A is a 'package-level' Peltier-effect cooler comprising plural semiconductor p/n segments and associated junctions. One set of junctions of the solid-state cooler is thermally coupled to the bottom of trenched carrier-wafer substrate 332, directly below sensor array 210. The opposite set of junctions of the solid-state cooler is thermally coupled to heat sink 346A. On the other side of ceiling 342, the portion of trenched carrier-wafer substrate 332 below readout circuit 316 is thermally coupled to heat sink 346B. Heat sinks 346A and 346B are not connected in the illustrated example but may be connected (e.g., be the same) in other examples. Heat-sink performance may be optimized in these examples in order to increase the Carnot efficiency of the solid-state cooler and to reduce the cooling load. Optimizing the overall cooling efficiency may also include engineering an appropriate Peltier-effect configuration. Peltier-effect components may be arranged in parallel, as shown in the drawing. Additionally, or in the alternative, Peltier-effect components may be arranged in series—stacking, in effect, multiple Peltier-effect layers 346A on top of each other. Parallel configurations, as shown in FIG. 3, may be used when the heat to be dissipated is large. Serial configurations may offer an advantage when the temperature differential is large (e.g. >40° C.). Peltier-effect materials are often heat-conducting. Therefore, as the required cooling load may be quite low it is important to minimize heat loss though the Peltier-materials themselves—e.g., by making the Peltier surface area as small as practicable. This tactic may include using the smallest Peltier-effect components available.

Continuing in FIG. 3, solid-state cooler 344B is a Peltier-effect cooler comprising one or more semiconductor bridges arranged within thermal-barrier zone 220 on sensor-wafer substrate 322. In examples in which the array of sensor elements is a CMOS array, solid-state cooler 344B may be fabricated within the thermal-barrier zone via standard CMOS processing. This option and its variants are described presently with reference to FIGS. 4 through 9.

More specifically, FIGS. 4 through 6 schematically show aspects of an example image sensor 406 having a solid-state cooler of type 344B in a first variant, wherein a barrier metal is used to make contact to the semiconductor bridges of the solid-state cooler. FIG. 4 is a cross-sectional view of image sensor 406 in cutting plane XY3 of FIG. 3. Whereas a state-of-the-art Peltier-effect cooler may comprise particularly selected semiconductor materials and high dopant levels, solid-state cooler 444B may be fabricated on sensor-wafer substrate 422 using standard CMOS materials and processing. Avoidance of non-standard materials and processing reduces manufacturing cost and prevents contamination of the highly optimized sensor elements.

In the example shown in FIG. 4, an alternating series of $p^+$-doped silicon bridges 448P and $n^+$-doped silicon bridges 448N lay across thermal-barrier zone 420, between sensor array 410 and readout circuit 416. For ease of illustration, FIG. 4 shows only two pairs of silicon bridges in the alternating series, but additional pairs may be used in some implementations. In these and other examples, individual silicon bridges may be separated via STI. Although the number and dimensions of semiconductor bridges 448 are not particularly limited, nanoscale (e.g., nanowire) semiconductor bridges are desirable for at least two reasons. First, the combined cross-sectional area of all of the bridges traversing the thermal-barrier zone should be relatively small in view of the high thermal conductivity of silicon. The skilled reader will understand, however, that efficient implementation of the Peltier effect requires sufficient electrical conductance from the hot to the cold end of the bridging material. Indeed, a figure of merit of a Peltier-effect cooler is the ratio of the electrical-to-thermal conductivity of the bridging material. That ratio, effectively constant in bulk silicon, is a function of the cross-sectional dimensions of a silicon nanowire, owing to the micrometer-scale phonon wavelength in silicon and the much smaller spatial extension of charge-carrier wave functions. In sum, quantum confinement of phonons, important to thermal conduction across the silicon-nanowire bridges, limits the rate of heat transfer across each bridge.

In some examples, therefore, each semiconductor bridge 448 comprises a silicon nanowire narrow enough to exhibit quantum confinement of phonons traversing the bridge. In some examples, each semiconductor bridge may be less than 100 nm in width. In these and other examples, each semiconductor bridge depth may have a depth of 200 to 250 nm, corresponding to the depth dimension in standard STI. As shown in FIG. 4, terminal bridges 448P and 448N of the alternating series of semiconductor bridges are oppositely doped. A current driver arranged in readout circuit 416 (not shown in the drawings) is configured to source electric current into p$^+$-doped terminal bridge 448P and to sink electric current from n$^+$-doped terminal bridge 448N.

In solid-state cooler 444B, electric current is conducted through the alternating series of semiconductor bridges 448 via a plurality of bridge links 450, each bridge link joining a pair of adjacent, non-terminal bridges of the alternating series, on opposite sides of thermal-barrier zone 420. Each bridge link comprises a different material and/or dopant level than any semiconductor bridge linked to it. In the example shown in FIGS. 4, 5, and 6, each bridge link comprises a so-called barrier metal. Here and in the art of semiconductor-device fabrication, 'barrier metal' refers to a thin layer of electronically conductive material arranged between two other materials to prevent inter-diffusion of the two other materials. In some examples, the barrier metal need not be a metal per se, but may be an electronically conductive ceramic. Examples of electronically conductive ceramics useful as barrier metals include titanium nitride (TiN), tantalum nitride, indium oxide, copper silicide, and tungsten nitride. It will be noted that the discussion above of the detailed advantages of parallel and series Peltier-effect configurations applies to each of the embodiments herein.

FIG. 5 is a schematic cross section of image sensor 406 in the X4Z cutting plane of FIG. 4; FIG. 6 is a cross section of image sensor 406 in the 4YZ cutting-plane segment of FIG. 4. FIG. 5 shows epitaxial structure 424 including signal lines 428, arranged above carrier-wafer trench 440. Semiconductor bridges 448 are arranged above epitaxial structure 424, with sensor-wafer trench 438 positioned above the epitaxial structure. FIG. 5 also shows a series of silicon junctions 552 immediately above semiconductor bridges 448—a consequence of the p$^+$ and n$^+$ bridge doping being shallower than the STI depth. FIG. 6 shows each of the above structures in addition to bridge links 450.

FIGS. 7 through 9 show aspects of an example image sensor 706 having a solid state cooler of type 344B in a second variant, wherein a metal is used to make contact to the semiconductor bridges of the solid-state cooler. FIG. 7 is a schematic cross-sectional view of image sensor 706 in cutting plane XY3 of FIG. 3. Just like the solid-state cooler of the first variant, solid-state cooler 744B includes an alternating series of p$^+$-doped silicon bridges 748P and n$^+$-doped silicon bridges 748N that lay across thermal-barrier zone 720, between sensor array 710 and readout circuit 716. As in the solid-state cooler of the first variant, the terminal bridges of the alternating series are oppositely doped, a current driver in readout circuit 716 sources electric current into the p$^+$-doped terminal bridge and sinks electric current from the n$^+$-doped terminal bridge, and electric current is conducted through the alternating series of semiconductor bridges via bridge links 750 that join pairs of adjacent, non-terminal bridges of the alternating series, on opposite sides of the thermal-barrier zone. In solid-state cooler 744B, however, each bridge link comprises a metal and is arranged substantially within thermal-barrier zone 720. In some examples, each bridge link may comprise a silicide-forming metal such as cobalt.

FIG. 8 is a schematic cross section of image sensor 706 in the X7Z cutting plane of FIG. 7; FIG. 9 is a schematic cross section of image sensor 706 in the 7YZ cutting-plane segment of FIG. 7. FIGS. 8 and 9 schematically show epitaxial structure 724 including signal lines 728, arranged above carrier-wafer trench 740. Semiconductor bridges 748 are arranged above epitaxial structure 724, with sensor-wafer trench 738 positioned above the epitaxial structure. FIG. 8 also shows that the junction between the semiconductor bridges and the bridge links includes an intervening contact layer 854. FIG. 9 schematically shows each of the above structures.

Figure 10A:
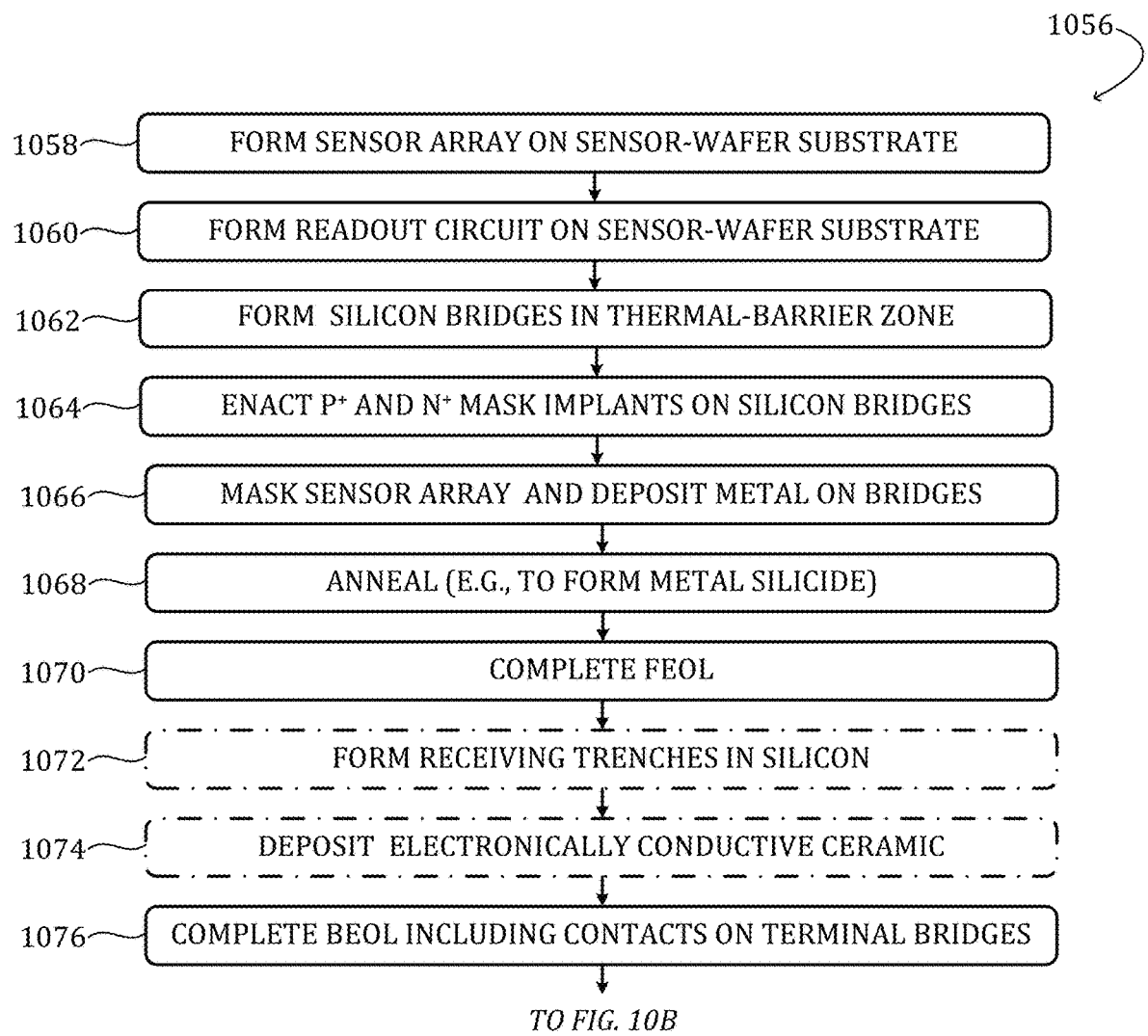
FIGS. 10A and 10B show aspects of an example method for fabricating an image sensor having an actively cooled sensor array.
Figure 10B:
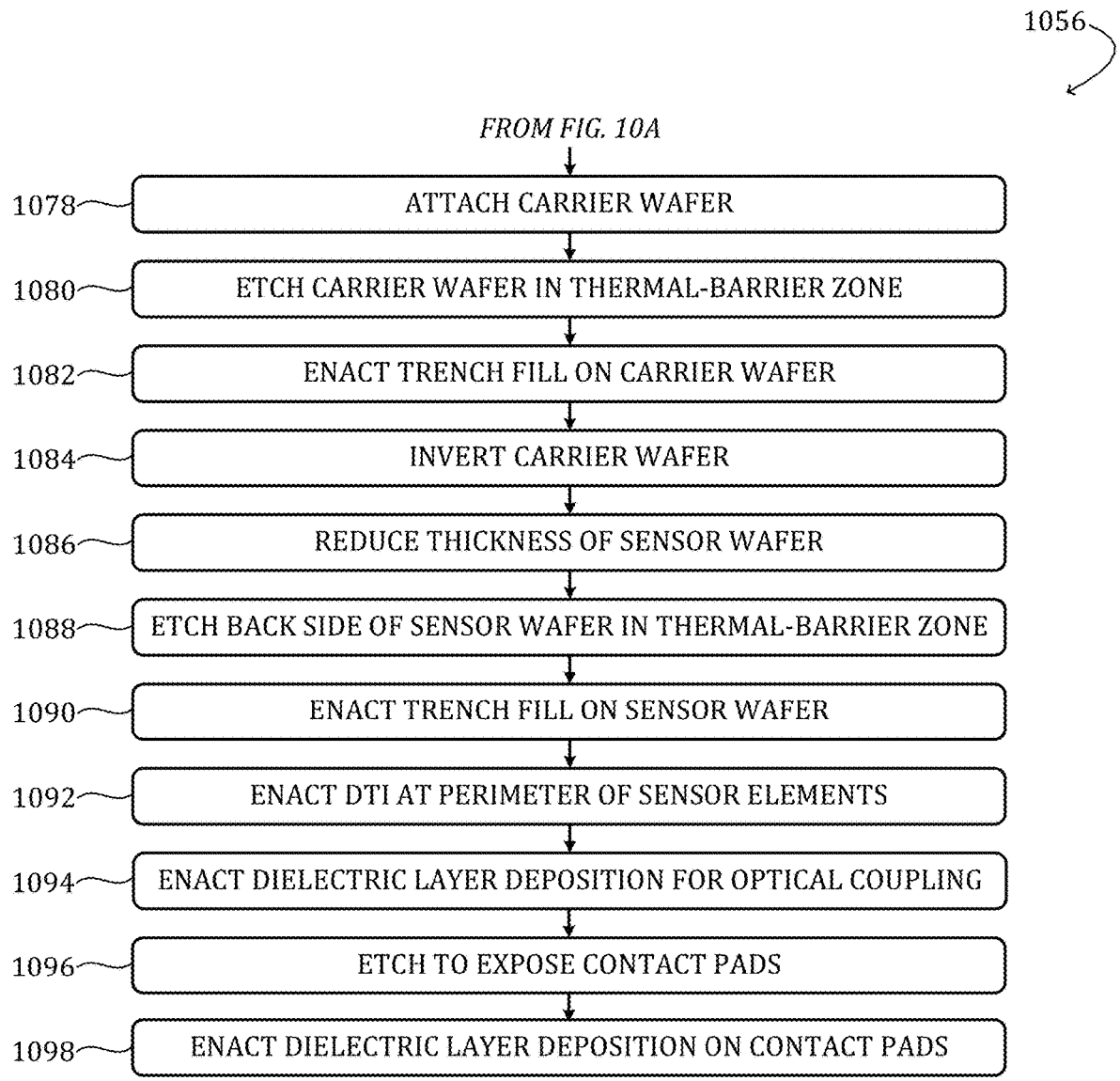

FIGS. 10A and 10B show aspects of an example method 1056 for fabricating an image sensor having an actively cooled sensor array. For ease of understanding, method 1056 is described with reference to the image-sensor configurations hereinabove. It will be understood, however, that method 1056 may be used to fabricate image sensors of different configurations. Image sensors fabricated according to method 1056 may exhibit reduced (e.g., minimized) dark current.

Starting at 1058 in FIG. 10A, the basic architecture of the image sensor is defined via FEOL processing, such as FEOL CMOS processing. At 1058 an array of sensor elements is formed in an epitaxial structure on a sensor-wafer substrate. At 1060 a readout circuit is formed in the epitaxial structure on the sensor-wafer substrate. In some examples, two or more of the operations above may be enacted concurrently.

At 1062 through 1076, a solid-state cooler is formed in the area of the sensor-wafer substrate that corresponds to the thermal-barrier zone. More specifically, at 1062 an alternating series of p$^+$-doped and n$^+$-doped silicon bridges is formed between the array of sensor elements and the readout circuit. Here a mask-and-etch process geometrically defines the series of silicon bridges in the thermal-barrier zone between the sensor array and the readout circuit—viz., in the area that will become the sensor-wafer trench. In some examples, this operation may be enacted concurrently with any, some or all of the operations indicated above. At 1064, p$^+$ and n$^+$ mask implants are applied to the silicon bridges to provide p$^+$ and n$^+$ doping, respectively. In some examples the p+ and n+ implants may be applied in the same process step in which the CMOS source and drain implants are applied.

At 1066 the sensor array is masked and a metal is deposited onto one or more of the silicon bridges. In examples as shown in FIGS. 7 through 9, where pairs of adjacent, non-terminal p+-doped and n+-doped bridges are linked by a metal, the metal may connect the pairs of adjacent non-terminal bridges. In some such examples, the metal may comprise a silicide-forming metal, such as cobalt. In more particular examples, cobalt may be deposited between the adjacent non-terminal silicon bridges. In some examples, different p+-doped or n+-doped silicon bridges may have different silicide-forming metals deposited thereon, for higher cooling efficiency. In some examples the metal implants may be laid down in the same process step in which metal contacts are provided to each source and drain of the CMOS. At 1068 the sensor wafer is subjected to annealing conditions. In examples where the metal deposited at 1066 is a silicide-forming metal, annealing results in metal-silicide formation. At 1070 the FEOL process is completed.

Steps 1072 and 1074 are enacted when fabricating an image sensor as shown in FIGS. 4 through 6, where pairs of adjacent non-terminal bridges are linked by a barrier metal in the form of an electronically conductive ceramic. At 1072 a plurality of receiving trenches is etched into the sensor-wafer substrate, on both sides of the sensor-wafer trench. At 1074 the plurality of receiving trenches is filled by epitaxial deposition of the electronically conductive ceramic, such as titanium nitride.

At 1076 the BEOL process is completed. Here a plurality of signal lines are formed on the sensor-wafer substrate, between the array of sensor elements and the readout circuit. As noted hereinabove, at least some of the signal lines may connect each column of sensor elements to the readout circuit. In some examples, this step also includes making the ohmic contacts required to drive current into and out of the terminal bridges. In other examples, a solid-state cooler may be fabricated on-die using any suitable fabrication approach.

At 1078 of FIG. 10B the epitaxial structure of the sensor-wafer is bonded to a carrier-wafer substrate. At 1080 the carrier-wafer substrate is etched in thermal-barrier zone to form a carrier-wafer trench between the array of sensor elements and the readout circuit. In some examples a dry etch/DTI may be enacted on the carrier wafer, leaving behind a ceiling of about 50 μm. In other examples, a trench of dimensions suitable for thermal isolation may be formed in the carrier-wafer substrate via other types of processing.

At 1082 a low-temperature oxide trench fill is enacted to fill the carrier-wafer trench with a dielectric, such as silicon oxide. At 1084 the carrier wafer is inverted to present the back side of the attached sensor wafer. At 1086 the sensor-wafer substrate is reduced to desired thickness. In some examples the sensor wafer may be thinned via chemical-and-mechanical polishing (CMP) to a thickness within an approximate range of 2.5 to 8.0 μm.

At 1088 the sensor-wafer substrate is etched in the thermal-barrier zone to form a sensor-wafer trench between the array of sensor elements and the readout circuit. In other examples, a trench of dimensions suitable for thermal isolation may be formed in the sensor-wafer substrate via other types of processing. At 1090 a low-temperature dielectric (e.g., silicon-oxide) trench fill is enacted to fill the sensor-wafer trench with the dielectric.

At 1092 additional DTI is enacted at the perimeter of the sensor array in order to improve sensor-array performance.

In some examples, substrate-wafer etching 1088 and the additional DTI 1092 may be enacted concurrently. At 1094 additional dielectric layer deposition is enacted on the back face of the sensor wafer to form one or more anti-reflective layers and/or a microlens array. To that end, oxides, nitrides, and other high-k material may be deposited on the back face. At 1096 the contact pads of the image sensor are exposed via etching. At 1098 dielectric layer deposition is enacted on the contact pads.

Figure 11:
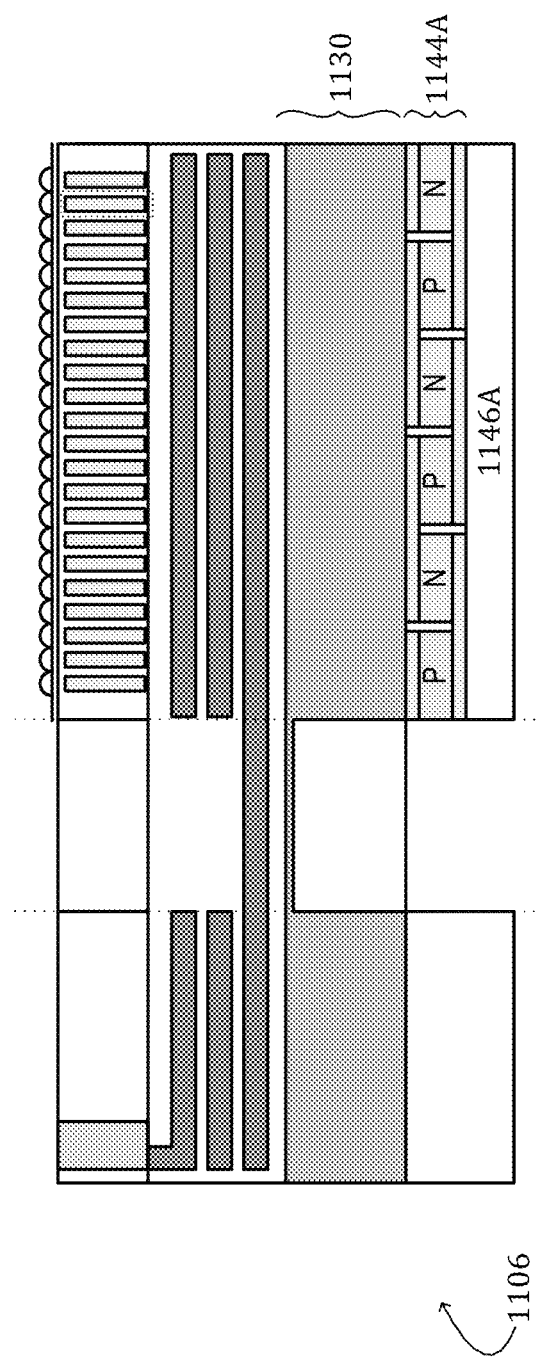
FIGS. 11 and 12 show aspects of two more example image sensors.
Figure 12:
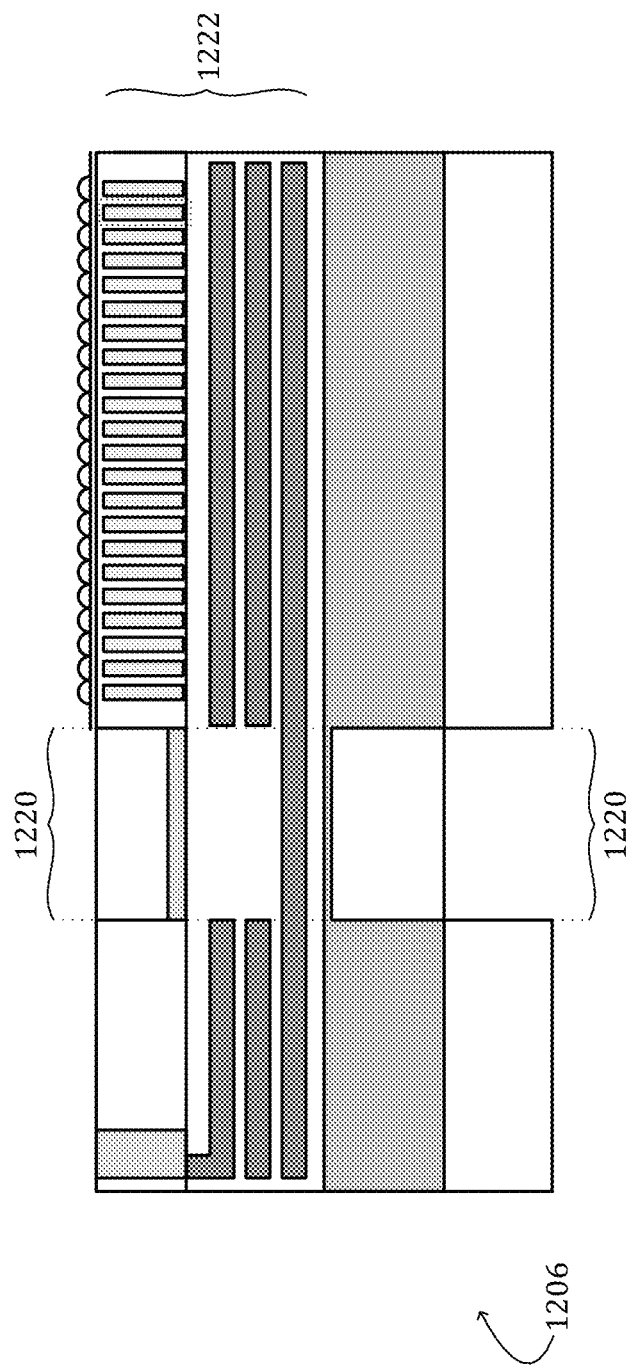

No aspect of the foregoing drawings or description should be understood in a limiting sense, for numerous variations, extensions, and omissions are also envisaged. Nanowire and package-level Peltier-effect coolers may be used together or separately achieve the objectives herein. FIG. 11 shows aspects of an example image sensor 1106 having a solid-state cooler 1144A in the form of a package-level Peltier-effect cooler, with no nanowire cooler. In that example, solid-state cooler 1144A is coupled between carrier-wafer substrate 1132 and heat sink 1146A. FIG. 12 shows aspects of an example image sensor 1206 having a solid-state cooler 1244B in the form of a nanowire Peltier-effect cooler, with no package-level cooler. In that example, solid-state cooler 1244B is arranged in thermal-barrier zone 1220 on sensor-wafer substrate 1222.

Although the illustrated implementations herein employ CMOS architecture, other device architectures may be combined with CMOS to realize certain advantages. In the illustrated methods, silicon oxide is used as a low thermal-conductivity fill material in the sensor- and carrier-wafer trenches. In other examples, fill materials based on cured polymer resins may be used. In still other examples, the trenches may be left unfilled (i.e., filled with air). Fabrication techniques other than etching/trench forming may be used to provide a suitable thermal-barrier zone between the sensor array and other componentry. In some examples, the thickness of any silicon traversing that zone may be limited (e.g., to 5 μm or less). Furthermore, additional modes of thermal isolation may be combined with those detailed above to further limit indirect heating of the sensor array and further reduce the cooling load. For instance, the image sensor may be set in an enclosure configured to limit convective heat transfer through air surrounding the sensor array.

In conclusion, one aspect of this disclosure is directed to an image sensor comprising an array of sensor elements each responsive to incident photon flux, a readout circuit coupled electronically to the array of sensor elements and configured to release an electronic signal varying in dependence on the incident photon flux, a thermal-barrier zone separating the array of sensor elements from the readout circuit, and a solid-state cooler coupled thermally to the array of sensor elements.

In some implementations, the array of sensor elements and the readout circuit are formed on a sensor-wafer substrate and the thermal-barrier zone includes a sensor-wafer trench etched into the sensor-wafer substrate. In some implementations, the sensor-wafer substrate supports an epitaxial structure comprising the array of sensor elements and the readout circuit, the epitaxial structure is bonded to a carrier-wafer substrate, and the thermal-barrier zone includes a carrier-wafer trench etched into the carrier-wafer substrate. In some implementations, the substrate-wafer trench and carrier-wafer trench are co-registered. In some implementations, one or both of the substrate-wafer trench and the carrier-wafer trench include a solid fill material of lower thermal conductivity than the substrate-wafer substrate or the carrier-wafer substrate. In some implementations, the fill material is silicon oxide formed via CMOS processing. In some implementations, the solid-state cooler comprises a Peltier-effect cooler. In some implementations, the solid-state cooler is arranged within the thermal-barrier zone. In some implementations, the array of sensor elements is a CMOS array, and the solid-state cooler is fabricated within the thermal-barrier zone via CMOS processing. In some implementations, the solid-state cooler includes: an alternating series of $p^+$-doped and $n^+$-doped silicon bridges that lay across the thermal-barrier zone, between the array of sensor elements and the readout circuit; and a plurality of bridge links, each joining a pair of adjacent, non-terminal bridges of the alternating series, on opposite ends of the thermal-barrier zone. In some implementations, each $p^+$-doped and $n^+$-doped silicon bridge comprises a silicon nanowire narrow enough to exhibit quantum confinement of phonons traversing the bridge. In some implementations, each bridge link includes an electronically conductive ceramic. In some implementations, each bridge link includes a metal.

Another aspect of this disclosure is directed to an image sensor comprising a carrier-wafer substrate, a sensor-wafer substrate, an array of sensor elements, a readout circuit, a thermal-barrier zone, and a Peltier-effect cooler. The sensor-wafer substrate supports an epitaxial structure bonded to the carrier-wafer substrate. Formed in the epitaxial structure, the array of sensor elements are each responsive to incident photon flux, and the readout circuit is coupled electronically to the array of sensor elements and configured to release an electronic signal varying in dependence on the incident photon flux. The thermal-barrier zone separates the array of sensor elements from the readout circuit and includes a sensor-wafer trench etched into the sensor-wafer substrate and a co-registered carrier-wafer trench etched into the carrier-wafer substrate. The Peltier-effect cooler includes: an alternating series of $p^+$-doped and $n^+$-doped silicon bridges that lay across the thermal-barrier zone, between the array of sensor elements and the readout circuit; and a plurality of bridge links, each joining a pair of adjacent, non-terminal bridges of the alternating series, on opposite ends of the thermal-barrier zone.

In some implementations, each bridge link comprises titanium nitride or cobalt.

Another aspect of this disclosure is directed to a method for fabricating an image sensor. The method comprises: forming an array of sensor elements on a sensor-wafer substrate; forming a readout circuit on the sensor-wafer substrate; forming a plurality of signal lines between the array of sensor elements and the readout circuit; forming a solid-state cooler between the array of sensor elements and the readout circuit; bonding a carrier-wafer substrate to an epitaxial structure of the sensor-wafer substrate; etching the carrier-wafer substrate in the thermal-barrier zone to form a carrier-wafer trench between the array of sensor elements and the readout circuit; reducing a thickness of the sensor-wafer substrate; and etching the sensor-wafer substrate in the thermal-barrier zone to form a sensor-wafer trench between the array of sensor elements and the readout circuit.

In some implementations, forming the solid-state cooler includes forming an alternating series of $p^+$-doped and $n^+$-doped silicon bridges between the array of sensor elements and the readout circuit. In some implementations, the method further comprises: masking the array of sensor elements; depositing a silicide-forming metal to connect pairs of adjacent non-terminal bridges in the alternating series of bridges; and annealing at least the sensor wafer. In some implementations, the method further comprises: enacting a low-temperature oxide trench fill to fill the carrier-wafer trench; and enacting a low-temperature oxide trench fill to fill the sensor-wafer trench. In some implementations, forming the array of sensor elements, the readout circuit, the plurality of signal lines, and the alternating series of bridges comprises front-end-of-line (FEOL) fabrication, the method further comprising, subsequent to completion of the FEOL fabrication: etching a plurality of receiving trenches in the sensor-wafer substrate; and filling the plurality of receiving trenches with an electronically conductive ceramic.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An image sensor comprising:
an array of sensor elements each responsive to incident photon flux;
a readout circuit coupled electronically to the array of sensor elements and configured to release an electronic signal varying in dependence on the incident photon flux;
a thermal-barrier zone separating the array of sensor elements from the readout circuit; and
a solid-state cooler coupled thermally to the array of sensor elements, the solid-state cooler including:
an alternating series of $p^+$-doped and $n^+$-doped silicon bridges that lay across the thermal-barrier zone, between the array of sensor elements and the readout circuit, and
a plurality of bridge links, each joining a pair of adjacent, non-terminal bridges of the alternating series, on opposite ends of the thermal-barrier zone.

2. The image sensor of claim 1 wherein the array of sensor elements and the readout circuit are formed on a sensor-wafer substrate and wherein the thermal-barrier zone includes a sensor-wafer trench etched into the sensor-wafer substrate.

3. The image sensor of claim 2 wherein the sensor-wafer substrate supports an epitaxial structure comprising the array of sensor elements and the readout circuit, wherein the epitaxial structure is bonded to a carrier-wafer substrate, and wherein the thermal-barrier zone includes a carrier-wafer trench etched into the carrier-wafer substrate.

4. The image sensor of claim 3 wherein the substrate-wafer trench and carrier-wafer trench are co-registered.

5. The image sensor of claim 3 wherein one or both of the substrate-wafer trench and the carrier-wafer trench include a solid fill material of lower thermal conductivity than the substrate-wafer substrate or the carrier-wafer substrate.

6. The image sensor of claim 5 wherein the fill material is silicon oxide formed via CMOS processing.

7. The image sensor of claim 1 wherein the solid-state cooler comprises a Peltier-effect cooler.

8. The image sensor of claim 1 wherein the solid-state cooler is arranged within the thermal-barrier zone.

9. The image sensor of claim 8 wherein the array of sensor elements is a CMOS array, and wherein the solid-state cooler is fabricated within the thermal-barrier zone via CMOS processing.

10. The image sensor of claim 1 wherein each $p^+$-doped and $n^+$-doped silicon bridge comprises a silicon nanowire narrow enough to exhibit quantum confinement of phonons traversing the bridge.

11. The image sensor of claim 1 wherein each bridge link includes an electronically conductive ceramic.

12. The image sensor of claim 1 wherein each bridge link includes a metal.

13. An image sensor comprising:
a carrier-wafer substrate;
a sensor-wafer substrate supporting an epitaxial structure bonded to the carrier-wafer substrate;
formed in the epitaxial structure, an array of sensor elements each responsive to incident photon flux;
formed in the epitaxial structure, a readout circuit coupled electronically to the array of sensor elements and configured to release an electronic signal varying in dependence on the incident photon flux;
a thermal-barrier zone separating the array of sensor elements from the readout circuit, the thermal-barrier zone including a sensor-wafer trench etched into the sensor-wafer substrate and a co-registered carrier-wafer trench etched into the carrier-wafer substrate; and
a Peltier-effect cooler including:
an alternating series of $p^+$-doped and $n^+$-doped silicon bridges that lay across the thermal-barrier zone, between the array of sensor elements and the readout circuit; and
a plurality of bridge links, each joining a pair of adjacent, non-terminal bridges of the alternating series, on opposite ends of the thermal-barrier zone.

14. The image sensor of claim 13 wherein each bridge link comprises titanium nitride or cobalt.

* * * * *